United States Patent [19]

Hantke

[11] Patent Number: 4,734,842
[45] Date of Patent: Mar. 29, 1988

[54] SIGNAL CONVERTER
[75] Inventor: Klaus Hantke, Erlangen, Fed. Rep. of Germany
[73] Assignee: Siemens Aktiengesellschaft, Munich, Fed. Rep. of Germany
[21] Appl. No.: 47,891
[22] Filed: May 8, 1987
[30] Foreign Application Priority Data May 20, 1986 [DE] Fed. Rep. of Germany ....... 3616711

[51] Int. Cl.⁴ .............................................. H02M 1/12
[52] U.S. Cl. ........................................ 363/41; 307/265
[58] Field of Search .................... 363/41, 79; 307/265, 307/266, 267

[56] References Cited

U.S. PATENT DOCUMENTS 4,217,546  8/1980  Milkovic .............................. 324/142
4,552,118  11/1985  Fukaya ................................. 307/267

FOREIGN PATENT DOCUMENTS 3424052  9/1986  Fed. Rep. of Germany .
2144287  2/1985  United Kingdom .

OTHER PUBLICATIONS

*Control Engineering*, Kolk, Richard W., "Understanding Modern Control Pulse Width Modulation", Apr. 1975, pp. 52-54.

*Primary Examiner*—Patrick R. Salce
*Assistant Examiner*—Anita M. Ault
*Attorney, Agent, or Firm*—Kenyon & Kenyon

[57] ABSTRACT

A signal converter for a motor drive of an electric motor comprises an operational amplifier, having an inverting input, a noninverting input and an output, and an integrator, the output signal of which being provided as a reference signal to the inverting input of the operational amplifier. An actual signal level corresponding to a measured voltage level as well as an auxiliary signal are provided to the noninverting input of the operational amplifier. The integrator is connected to a first summing point. The first summing point is connected by way of a first lowpass filter to the output of the operational amplifier and by way of a second lowpass filter to the noninverting input of the operational amplifier. The noninverting input of the operational amplifier is also coupled by way of a second summing point to the actual signal input and to an amplifier circuit. A reference signal is provided to a first input of the amplifier. A second input of the amplifier circuit is coupled by way of a sign circuit to the actual signal input, and a third input of the amplifier is connected by way of a gain selection circuit to a measuring range input signal. The signal converter is capable of high linearity and high resolution.

12 Claims, 1 Drawing Figure

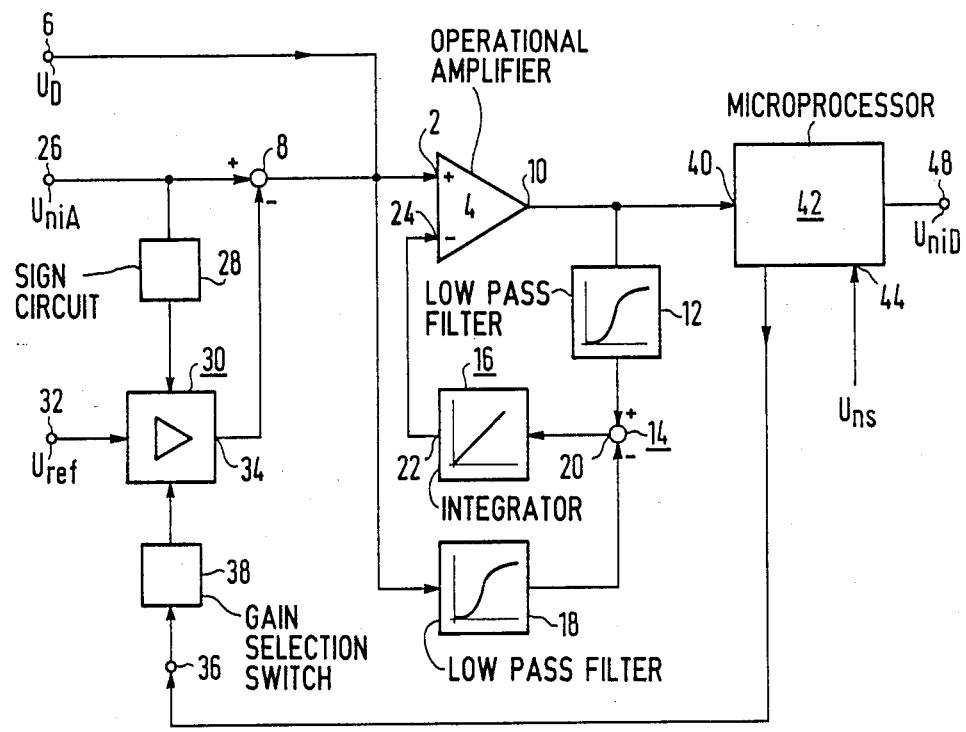

SIGNAL CONVERTER

BACKGROUND OF THE INVENTION

1. Technical Field

The present invention relates to the field of signal converters used with electric motor drives and, more particularly, to one comprising an operational amplifier and an integrator, the output signal of which is a reference input signal for the operational amplifier.

2. Description Of The Related Art

Signal converters are used with electric motor drives to provide, for example, motor speed or armature current output signals to microprocessors. Signal converters for such arrangements are commercially available which are required for the potential-isolated further processing of measured motor speed values. For instance, it is known to further process a reference value and actual measured values of the motor speed. No data losses should occur in this further processing. In the data processing activity the measured signal level is converted into a frequency proportional to the level of the measured signal and is thus transmitted as a frequency and not as a voltage to the data processor. On the low-voltage side of the drive, this frequency is again converted into a voltage proportional to the frequency. It has been found that especially in the case of a high common mode, the linearity of these signal converters is not sufficient. Offset compensation is necessary especially if inexpensive fast precision amplifiers are employed for realizing the integrator.

From the German Offenlegungsschrift No. 34 24 052, a signal converter with a first integrator comprising an operational amplifier is known which is followed by a threshold level setting device. The first integrator is coupled to the measured signal input to the converter. The output of the threshold level setting device actuates a switching element. The output of the switching element is coupled to the summing point of the first integrator. In addition, a second integrator also comprising an operational amplifier is provided, the summing point of which is also tied to the measured signal input and to the output of the switching element. The output signal of the second integrator is the input reference signal of the first integrator. Thereby, the signal converter is given reasonable linearity because a correction signal is formed by the second integrator which makes the first integrator track until it is assured that the output signal corresponds to the input signal exactly.

However, it is still necessary to improve the linearity and resolution of such arrangements so that the digital sampling of analog output signals can also be improved and the further digital processing improved thereby.

SUMMARY OF THE INVENTION

The problems and related problems of known signal converters are solved by the principles of the present invention. An actual measured signal as well as an auxiliary signal are provided to a noninverting input of an operational amplifier, also having an inverting input and an output. A first summing point serving as an input to an integrator is connected by way of a first lowpass filter to the output of the operational amplifier and by way of a second lowpass filter to the noninverting input of the operational amplifier. The noninverting input of the operational amplifier is coupled by way of a second summing point to the actual measured signal and to an amplifier circuit having three inputs. At a first input of the amplifier, a reference voltage is provided. To a second input of the amplifier circuit is connected the actual measured signal input by way of a sign circuit. A third input of the amplifier is coupled by means of a gain selection switch to a measuring range signal output of a microprocessor.

In the embodiment according to the invention the actual measured signal level is converted by means of the auxiliary signal and the operational amplifier into a pulse width-modulated signal. This signal is compared by means of the first lowpass filter at the first summing point input to the integrator with the actual measured signal level. The actual measured signal level arrives at the first summing point by way of the second lowpass filter. The integrator forms a correction signal output to the operational amplifier which makes the operational amplifier track until it is assured that its output signal corresponds to the input signal exactly. Thereby, the linearity of the signal converter depends exclusively on the parameters of the integrator for static and dynamic events of the actual measured signal. At the second summing point, a reference signal, the amplitude of which is set by the gain selection switch as a function of the measuring range is subtracted from the actual measured signal. In this manner, the overall measuring range is subdivided into several measuring ranges of the same size. Thus, a signal converter with a high linearity and a high resolution in each of the measuring ranges is obtained for static and dynamic occurrences of the actual measured signal level.

In a particularly advantageous circuit arrangement of the present signal converter, the output of the operational amplifier is coupled to a first input of the microprocessor. In addition, a reference signal related to the measured parameter is fed to a second input of the microprocessor. The pulse width of the pulse width-modulated output signal of the operational amplifier is sampled at the output of the operational amplifier at the system clock frequency of the microprocessor and the actual value of the measured signal level is determined. In addition, the microprocessor sets the corresponding measuring range at the gain selection switch after comparing the output of the operational amplifier with the reference signal.

BRIEF DESCRIPTION OF THE DRAWING

The FIGURE is a block schematic diagram of a signal converter according to the invention.

DETAILED DESCRIPTION

Referring to the FIGURE, an advantageous circuit arrangement of a signal converter according to the invention is shown in block schematic diagram form comprising an operational amplifier 4 having an inverting input 24, a noninverting input 2, and an output 10 coupled to a first summing point 14 by way of a first lowpass filter 12. The noninverting input 2 of the operational amplifier 4 is connected to an auxiliary input terminal 6 and to a second summing point 8. At the noninverting input 2 of the operational amplifier 4, an actual measured signal as well as an auxiliary signal $U_D$ is present. A saw tooth voltage, preferably a triangular voltage, and in particular a symmetrical triangular voltage can be provided as the auxiliary signal $U_D$. The actual measured signal is, for instance, an actual analog speed value $U_{niA}$ of a d-c or three-phase tachometer generator of a feed drive of a machine tool or an armature current value. In the case of a speed value, the actual speed value $U_{niA}$ is combined with the auxiliary signal $U_D$ at the noninverting input 2 of the operational amplifier 4, whereby a pulse width-modulated signal is present at the output 10 of the operational amplifier 4. This output 10 is connected to the first lowpass filter 12, the output of which is connected to the first summing point 14 of an integrator 16. This first summing point 14 is connected via a second lowpass filter 18 to the noninverting input 2 of the operational amplifier 4. Thereby, the arithmetic mean value of the pulse width-modulated output signal of the operational amplifier 4 is compared at the summing point 14 with the actual analog speed value $U_{niA}$. The time constants of the first and second lowpass filters 12 and 18 are set the same so that dynamic changes in the actual measured signal provided to the noninverting input 2 do not result in errors. An existing difference signal at the output 20 of the summing point 14 is integrated by the integrator 16 to form a correction signal. The correction signal present at the output 22 of the integrator 16 is fed to the inverting input 24 of the operational amplifier 4. Thereby, the operational amplifier 4 is made to track until the pulse width-modulated signal at the output 10 corresponds to the actual speed value $U_{niA}$ exactly.

The actual speed value $U_{niA}$ is fed by way of measured signal input terminal 26 and the further summing point 8 to the noninverting input 2 of the operational amplifier 4. In addition, the measured signal at signal input 26 is also connected via a sign circuit 28 to an input of an amplifier circuit 30. A reference voltage $U_{ref}$ is provided at another input terminal 32 of the amplifier circuit 30. A measuring range input 36 is connected to a third input to the amplifier circuit 30 via a gain selection switch 38. The output 34 of the amplifier circuit 30 is connected to the second summing point 8.

The output 10 of the operational amplifier 4 is tied to a first input 40 of a microprocessor 42. A second input 44 of the microprocessor 42 is, for example, a speed reference signal $U_{ns}$. From a comparison of the first and second inputs, the microprocessor 42 provides the measuring range signal to the input 36 of the gain selection circuit 38. At the output 48 of the microprocessor 42, a digital signal $U_{niD}$ is provided which corresponds to the actual analog speed value $U_{niA}$ of the measured signal level at input 26.

In the circuit thus described, the actual speed value $U_{niA}$ of a d-c or three-phase tachometer generator and thereby of the actual speed value $U_{niA}$ of the feed drive of a machine tool is converted by means of the auxiliary signal $U_D$ of the slaved operational amplifier 4 into a pulse width-modulated signal. The pulse width-modulated signal output of the operational amplifier is processed further by means of the microprocessor 42. To this end, the pulse width is sampled at the system clock frequency of the microprocessor 42. The dynamic requirements for a feed drive of an electric machine tool calls, for instance, for a sampling time of 1 msec. With a system clock frequency of 8 MHz, a resolution of 8000 in one direction of rotation or ±4000 in two directions of rotation of the drive is obtained thereby. In order to achieve a resolution or a positioning range of 1: 100,000, the total measuring range can be subdivided. According to a first subdivision, a reference voltage $U_{ref}$ is fed to the input 32 of the amplifier circuit 30. In other words a maximum speed of rotation of the feed drive of, for example, 3000 rpm can be set to correspond to an actual speed signal level value of 10 V. For a positioning range of 1: 100,000 for one direction of rotation, the total measuring range of 10 V can be subdivided into ten individual measuring ranges of 1 V each.

So that the individual measuring ranges always have the same size, a reference voltage $U_{ref}$, the amplitude of which can be varied by means of amplifier circuit 30 is subtracted from the actual speed value $U_{niA}$ at the second summing point 8 in the following manner. At the start of the second individual measuring range, the reference voltage $U_{ref}=1$ V is subtracted from the actual speed value $U_{niA}$ which is greater than or equal to 1 V. Thereby, the second measuring range starts at 0 V although the actual speed value $U_{niA}$ is larger than 1 V. At the transition from the second to the third individual measuring range, a reference voltage of $U_{ref}=2$ V is subtracted. This reference voltage $U_{ref}$ is determined from the constant reference voltage $U_{ref}=1$ V which is present at the input 32, and an amplifier voltage gain corresponding to A=2 is set by means of the amplifier circuit 30. Thereby, also the third measuring range starts at zero although the actual speed value $U_{niA}$ is greater than or equal to 2 V. By changing the amplitude of the reference voltage $U_{ref}$ as a function of the measuring ranges and using the reference voltage $U_{ref}$ as the offset voltage to the actual speed value $U_{niA}$, the total measuring range can be subdivided into as many equal measuring ranges as desired, all of which have the same resolution. Thus, a signal converter with a high linearity and a positioning range of approximately 1: 100,000 is obtained.

The sign circuit 28 determines the sign of the actual speed value $U_{niA}$, and thus the direction of rotation of the feed drive of the machine tool. For positive actual speed values $U_{niA}$, the offset voltage determined from the reference voltage $U_{ref}$ is subtracted from the actual speed value $U_{niA}$. As soon as the sign of the actual speed values $U_{niA}$ changes, the sign of the offset voltage determined from the reference voltage $U_{ref}$ is changed by means of the sign circuit 28. Thereby, the offset voltage is added at the second summing point 8 to the negative actual speed value $U_{niA}$. Thus, also, positive and negative measuring ranges for a motor having two directions of rotation will be of equal size and have the same resolution.

Selecting an appropriate measuring range, and thereby, modifying the amplitude of the reference voltage $U_{ref}$ is carried out by means of the microprocessor 42. For selecting the measuring range, the speed reference value $U_{ns}$ and the actual speed value $U_{niA}$ are compared with each other. As a result, a measuring range signal is provided to gain selection switch 38.

What is claimed is:

1. A signal converter comprising:
   (a) an operational amplifier having an inverting input, a noninverting input and an output, a scaled signal corresponding to a measured voltage level and an auxiliary signal coupled to the noninverting input of the operational amplifier;
   (b) an integrator having an input and an output, the output of the integrator being coupled to the inverting input of the operational amplifier as a correction signal;
   (c) a first lowpass filter having an input and an output, the input coupled to the output of the operational amplifier;
   (d) a first summing point coupled to the input of the integrator and to the output of the first lowpass filter;

(e) a second lowpass filter having an input and an output, the input coupled to the non-inverting input of the operational amplifier and the output coupled to the first summing point;

(f) a second summing point, having first and second inputs and an output, a signal to be converted being coupled to the first input and the output being the scaled signal coupled to the non-inverting input and of the operational amplifier;

(g) a sign circuit having an input an output indicative of the sign of the signal to be converted, the input coupled to the first input of the second summing point;

(h) a gain selection circuit having an input and an output, the input being a signal indicative of a measuring range; and (i) an amplifier circuit having first, second and third inputs and an output, the output coupled to the second input of the second summing point, the first input coupled to the output of the gain selection circuit, the second input coupled to the output of the sign circuit and the third input coupled to a reference signal.

2. A signal converter according to claim 1, wherein time constants for the first and second lowpass filters have the same magnitude.

3. A signal converter according to claim 1, the output of the operational amplifier being coupled to a first input of a microprocessor.

4. Signal converter according to claim 3, the microprocessor having a second input, a reference signal being coupled to the second input of the microprocessor.

5. A signal converter according to claim 3, the measuring range input signal to the gain selection circuit being provided by the microprocessor.

6. In a signal converter comprising an operational amplifier having an inverting input, a non-inverting input and an output, the input signal to the non-inverting input being an actual signal to be converted, means coupled to the output of the operational amplifier for providing a correctional signal input to the inverting input of the operational amplifier comprising:

(a) a first lowpass filter coupled to the output of the operational amplifier;

(b) a second lowpass filter coupled to the non-inverting input of the operational amplifier;

(c) a first summing point having an output and first and second inputs coupled to the first and second lowpass filters respectively for comparing a mean signal value output of the first lowpass filter with an analog signal value output of the second lowpass filter; and (d) an integrator coupled to the inverting input of the operational amplifier and to the output of the first summing point, the integrator providing the correction signal input to the inverting input of the operational amplifier.

7. In a signal converter comprising an operational amplifier having an inverting input, a non-inverting input and an output, means coupled between the non-inverting input and the output of the operational amplifier for scaling a signal input to the non-inverting input of the operational amplifier, the scaling means comprising:

(a) a microprocessor coupled to the output of the operational amplifier for sampling the output of the operational amplifier, comparing the sampled value with a reference signal value, and providing an output signal indicative of a measuring range;

(b) a gain selection circuit coupled to the output signal of the microprocessor;

(c) an amplifier coupled to the gain selection circuit and to a reference signal input for providing a scaling signal output; and (d) a summing point having a first input being the signal to be scaled, a second input being the scaling signal output of the amplifier, and an output being the scaled signal input to the non-inverting input of the operational amplifier.

8. A method for scaling a signal input to a signal converter, the signal converter for converting the input signal to a pulse width modulated output signal coupled to a first input of a microprocessor, the scaling method including the steps of:

sampling the pulse width modulated output signal at a predetermined frequency to determine a signal value;

comparing the signal value result of the sampling with a reference signal value;

calculating an actual signal value measuring range from the result of the comparison;

providing an output signal indicative of the actual signal value measuring range to a gain selection circuit for an amplifier;

establishing a scaling level at the output of the amplifier responsive to the gain selection circuit; and scaling the signal input to the signal converter responsive to the scaling level output of the amplifier.

9. The method for operating a signal converter according to claim 8 wherein the step of calculating an actual signal value measuring range when the reference signal value and the signal value are both large includes setting an actual signal value measuring range at the gain selection circuit corresponding to the reference signal value.

10. The method for operating a signal converter according to claim 8 wherein the step of calculating a signal value measuring range when the reference signal and the actual signal are both large when referred to a maximum measuring range includes setting an actual signal value measuring range at the gain selection circuit corresponding to the reference signal.

11. In a signal converter comprising means for converting an input signal to a pulse width modulated output signal, a method of scaling the input signal to the signal converter including the steps of:

(a) sampling the pulse width modulated output signal at a predetermined frequency resulting in a signal value;

(b) comparing the signal value result of the sampling with a reference signal value;

(c) establishing a scaling level responsive to the comparison; and (d) substracting the scaling level from the input signal to the signal converter.

12. The scaling method of claim 11 further comprising the steps of:

determining the sign of the input signal; and in the event of a negative input signal, establishing a negative scaling level such that a negative scaling level is subtracted from the negative input signal obtaining a less negative input signal to the signal converter.

* * * * *